US 6,550,982 B2

(12) United States Patent
Auburger et al.

(10) Patent No.: US 6,550,982 B2
(45) Date of Patent: Apr. 22, 2003

(54) OPTOELECTRONIC SURFACE-MOUNTABLE MODULE AND OPTOELECTRONIC COUPLING UNIT

(75) Inventors: Albert Auburger, Regenstauf (DE); Hans Hurt, Regensburg (DE); Bernd Waidhas, Sinzing (DE); Joachim Reill, Zeitlarn (DE); Gerhard Kuhn, Köfering (DE); Martin Weigert, Hardt (DE); Markus Wicke, Lappersdorf-Einhausen (DE); Peter Gattinger, Backnang (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/907,772

(22) Filed: Jul. 18, 2001

(65) Prior Publication Data

US 2002/0021871 A1 Feb. 21, 2002

(30) Foreign Application Priority Data

Jul. 18, 2000 (DE) .......................... 100 34 865

(51) Int. Cl.[7] .................................. G02B 6/36
(52) U.S. Cl. .............................. 385/88; 385/92; 385/93; 385/94
(58) Field of Search ...................... 385/88–94

(56) References Cited

U.S. PATENT DOCUMENTS

| 4,355,321 | A | * | 10/1982 | Yeats | .......................... 357/30 |
|---|---|---|---|---|---|
| 5,239,198 | A | * | 8/1993 | Lin et al. | ..................... 257/693 |
| RE35,069 | E | * | 10/1995 | Hallenbeck et al. | ........ 250/216 |
| 5,578,525 | A | * | 11/1996 | Mizukoshi | ................... 437/206 |
| 5,790,730 | A | * | 8/1998 | Kravitz et al. | ................. 385/49 |
| 5,973,337 | A |   | 10/1999 | Knapp et al. | .................. 257/99 |
| 6,144,507 | A | * | 11/2000 | Hashimoto | ................... 359/819 |
| 6,150,193 | A | * | 11/2000 | Glenn | ......................... 438/113 |
| 6,228,676 | B1 | * | 5/2001 | Glenn et al. | ................. 438/107 |
| 6,303,978 | B1 | * | 10/2001 | Daniels et al. | ............... 257/642 |
| 6,396,043 | B1 | * | 5/2002 | Glenn et al. | ............. 250/208.1 |

FOREIGN PATENT DOCUMENTS

| DE | 195 23 580 A1 | 2/1996 | ........... G02B/6/122 |
| DE | 195 27 026 A1 | 2/1997 | ........... G02B/6/42 |
| DE | 196 43 072 A1 | 4/1998 | ........... H01L/23/48 |
| DE | 197 54 874 A1 | 6/1999 | ........... H01L/21/60 |
| DE | 198 54 899 C1 | 12/1999 | ........ H01L/25/075 |
| EP | 0 809 304 A2 | 11/1997 | ........... H01L/33/00 |
| EP | 0 936 485 A1 | 8/1999 | ............ G02B/6/42 |
| JP | 06 310 759 A | 11/1994 | ........... H01L/33/00 |

* cited by examiner

Primary Examiner—Brian Healy
Assistant Examiner—Kevin S Wood
(74) Attorney, Agent, or Firm—Laurence A. Greenberg; Werner H. Stemer; Ralph E. Locher

(57) ABSTRACT

An optoelectronic module is disclosed, which can be connected optically and electrically in a simply way. The optoeletronic module consists of a SMD-housing (1) for the electrical connection and a connector (5), on which a MT-plug is fitted, for the optical connection. The SMD-housing is assigned to the MT-plug. It includes a plug connector (5), which contains the optical/electrical interface and is positively fixed in the housing.

11 Claims, 3 Drawing Sheets

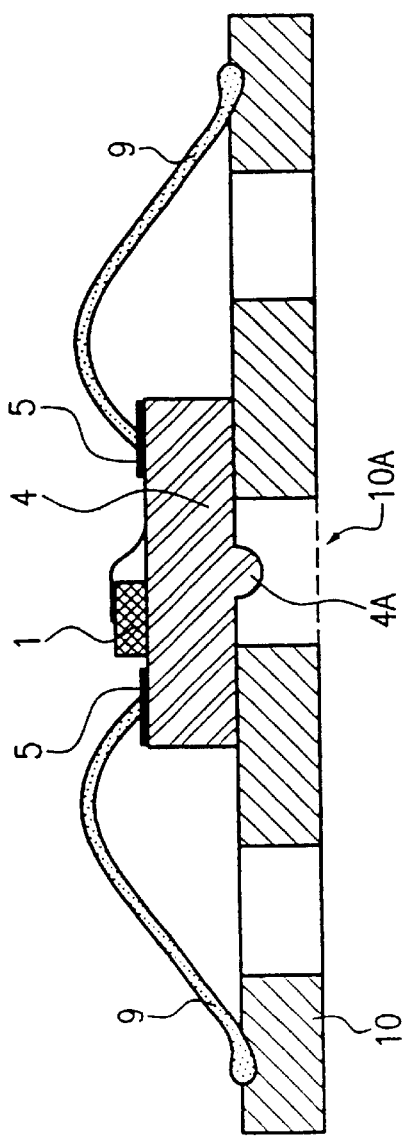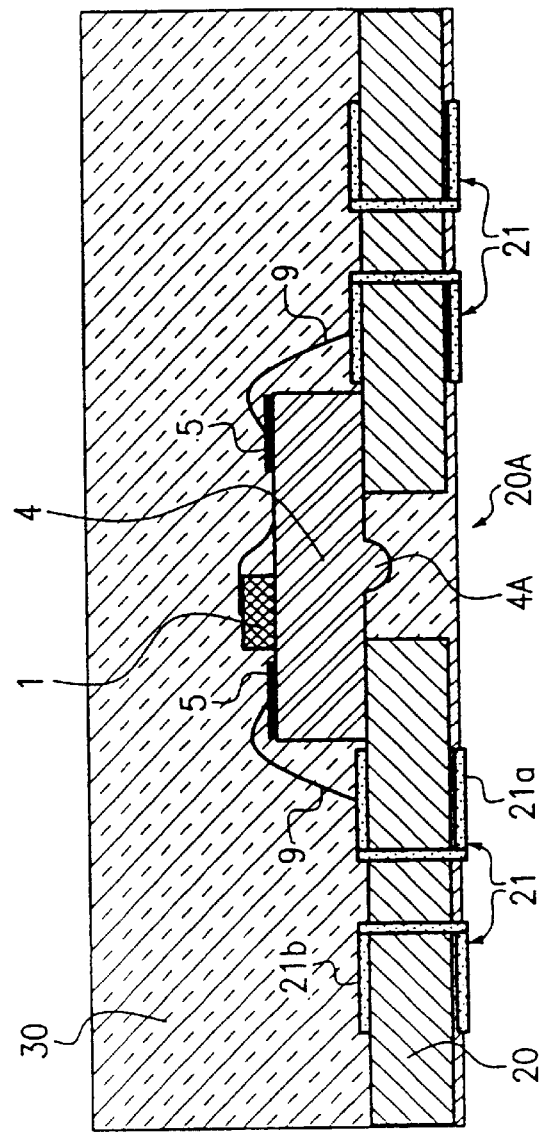

OPTOELECTRONIC SURFACE-MOUNTABLE MODULE AND OPTOELECTRONIC COUPLING UNIT

BACKGROUND OF THE INVENTION

FIELD OF THE INVENTION

The invention relates to an optoelectronic module in which an optoelectronic component is fixed on a substrate and is connected to internal electrical connections of the module. These internal electrical connections are connected via electrical leads to external electrical connections which are provided in a common mounting plane and are configured in such a way that they allow a surface mounting of the optoelectronic module on a printed circuit board. Thus, the present invention is concerned in general with the field of electronic and optoelectronic components which can be used for a surface mounting technology (SMT). In particular, the present invention relates to optoelectronic modules which can be used in a surface mount technology in which the external electrical connections are formed by a ball grid array (BGA), that is to say by a regular configuration of fusible or reflowable solder bumps. The present invention also relates to optoelectronic modules which can also be coupled to an optical fiber for transmitting information and data signals.

An optoelectronic module of this type is known per se in the prior art. Published, Non-Prosecuted Patent Application No. DE 196 43 072 A1 describes an optically and electrically coupleable optoelectronic module in which the electrical connection includes external contacts on an SMD housing and an optical connection includes a connector socket compatible with a so-called MT connector (mechanically transferable connector). In this case, the external connections can be embodied using BGA technology (BGA=ball grid array). The optoelectronic component proposed here can thus be coupled to an optical waveguide whose optical signals are converted into electrical signals in the component. The exemplary embodiment shows a housing configured using SMD technology, with external electrical connections which can be soldered to conductor tracks on a printed circuit and whose ends, which project into the housing, are connected to a printed circuit board containing an electronic circuit required for operation of the optical component. A connector socket is fixed in a side wall of the housing, the end of the optical waveguide being routed in the socket, the connector socket being the mating piece with respect to an MT connector. However, the production of this known optoelectronic component requires a relatively high outlay since, on the one hand, a housing has to be provided and, on the other hand, a connector socket that is complicated to manufacture has to be inserted into a side opening of the housing, through which the optical connection for the optical waveguide is formed.

Published, Non-Prosecuted Patent Application No. DE 197 54 874 A1 discloses a method for converting a substrate with edge contacts into a ball grid array, a ball grid array produced by this method, and a flexible wiring for converting a substrate with edge contacts into a ball grid array. In this case, a substrate with edge contacts is converted into a ball grid array with the aid of a flexible wiring. The flexible wiring has, on the underside, flat connections for receiving fusible bumps and whose conductors leading to the outside from the connections have exposed ends. In this case, the exposed ends of the conductors are bent in a U-shaped manner around the end face of the substrate and are electrically conductively connected to the edge contacts of the substrate. However, this document is concerned only with electronic components, and not with optoelectronic optical waveguide components.

SUMMARY OF THE INVENTION

It is accordingly an object of the invention to provide an optoelectronic surface-mountable module which overcomes the above-mentioned disadvantages of the heretofore-known modules of this general type and which is simpler to produce and in which, in particular, the coupling to an optical waveguide can be effected in a less complicated manner.

With the foregoing and other objects in view there is provided, in accordance with the invention, an optoelectronic surface-mountable module, including:

a substrate having a first side with a first main surface and a second side with a second main surface opposite the first main surface;

an optoelectronic component mounted on the first side of the substrate, the optoelectronic component utilizing a plurality of wavelengths;

the substrate being transparent to at least one of the wavelengths utilized by the optoelectronic component;

internal electrical connections provided on the first main surface and electrically connected to the optoelectronic component;

external electrical connections connected to the second main surface of the substrate;

electrical leads connecting the internal electrical connections to the external electrical connections; and the external electrical connections defining a light passage opening opposite the optoelectronic component.

In other word, according to a first aspect of the present invention, an optoelectronic surface-mountable module, includes:

a substrate;

at least one optoelectronic component, mounted on the side of a first main surface of the substrate;

internal electrical connections, which are applied on the first main surface and are electrically connected to the optoelectronic component;

external electrical connections, which are connected to the second main surface of the substrate, the main surface being opposite to the first main surface, and are connected to the internal electrical connections by electrical leads;

the substrate is transparent to at least one of the wavelengths which can be utilized by the optoelectronic component; and a light entry opening and/or light exit opening for the optoelectronic component is defined by the positioning and/or structure of the external electrical connections.

In a first embodiment in accordance with the first aspect, the external electrical connections may be embodied using BGA technology (BGA=ball grid array) and thus be formed, in particular, from fusible bumps connected to the electrical leads, the light entry opening and/or light exit opening being defined by the interspace between two bumps. In a second embodiment in accordance with the first aspect, the external electrical connections may be formed by a lead frame, the light entry opening and/or light exit opening being formed by a through opening of the lead frame.

In a second embodiment in accordance with the first aspect, the external electrical connections may be formed by a lead frame, the light entry opening and/or light exit opening being formed by a through opening of the lead frame.

In a third embodiment in accordance with the first aspect, the external electrical connections may be led through a plastic support through the use of through contacts, the light entry opening and/or light exit opening being formed by a through opening of the plastic support.

With the objects of the invention in view there is also provided, an optoelectronic surface-mountable module, including:

a substrate having a main surface;

the main surface having a relief structure with recessed sections and elevated sections, one of the recessed sections having a bottom area;

an optoelectronic component mounted in the bottom area of the one of the recessed sections, the optoelectronic component having connections;

internal electrical connections applied on given ones of the recessed sections and being electrically connected to the connections of the optoelectronic component;

external electrical connections applied on the elevated sections; and electrical leads connecting the internal electrical connections to the external electrical connections.

In other words, a second aspect of the present invention describes an optoelectronic surface-mountable module, having:

a substrate, whose one main surface has a relief structure with recessed and elevated sections;

at least one optoelectronic component mounted on the bottom area of a recessed section;

internal electrical connections, which are applied on recessed sections and are electrically connected to the connections of the optoelectronic component; and external electrical connections which are applied on elevated sections and are connected to the internal electrical connections by electrical leads.

In the optoelectronic module in accordance with the second aspect of the invention, too, the external electrical connections may be formed by a BGA and thus, in particular, from fusible bumps which are connected to the leads.

The invention in accordance with the two aspects described above thus has the major advantage that an optoelectronic module does not have to be formed in a complicated manner with a housing, a lateral housing opening and a connector socket to be formed therein. Rather, the production of a module according to the invention is oriented toward forming a light entry opening or light exit opening between external electrical contact sections, through which opening a radiation pencil or beam can be introduced into a coupled optical fiber or a radiation pencil received from an optical fiber can be introduced into the module.

With the objects of the invention in view there is also provided, an optoelectronic coupling unit, including:

a substrate having a first side with a first main surface and a second side with a second main surface opposite the first main surface;

an optoelectronic component mounted on the first side of the substrate, the optoelectronic component utilizing a plurality of wavelengths;

the substrate being transparent to at least one of the wavelengths utilized by the optoelectronic component;

internal electrical connections provided on the first main surface and electrically connected to the optoelectronic component;

external electrical connections connected to the second main surface of the substrate;

electrical leads connecting the internal electrical connections to the external electrical connections;

the external electrical connections defining a light passage opening opposite the optoelectronic component;

a printed circuit board electrically connected to the optoelectronic component;

the printed circuit board having a through opening formed therein, the through opening being aligned with the light passage opening; and the printed circuit board having a side remote from the optoelectronic component and being configured to be coupled to an optical waveguide at the side remote from the optoelectronic component.

In other words, the optoelectronic module according to the invention can be combined to form an optoelectronic coupling unit by being assembled together with a circuit board. By way of example, for this purpose, a circuit board on which electrical connections and leads are printed has a through opening on whose side remote from the module an optical waveguide can be coupled. By way of example, the module can be soldered onto the printed circuit board using the reflow method known in SMT technology.

With the objects of the invention in view there is also provided, an optoelectronic coupling unit, including:

a substrate having a first side with a first main surface and a second side with a second main surface opposite the first main surface;

an optoelectronic component mounted on the first side of the substrate, the optoelectronic component utilizing a plurality of wavelengths;

the substrate being transparent to at least one of the wavelengths utilized by the optoelectronic component;

internal electrical connections provided on the first main surface and electrically connected to the optoelectronic component;

external electrical connections connected to the second main surface of the substrate;

electrical leads connecting the internal electrical connections to the external electrical connections;

the external electrical connections defining a light passage opening opposite the optoelectronic component;

a printed circuit board electrically connected to the optoelectronic component;

the printed circuit board having a lateral entry opening formed therein, the lateral entry opening being aligned with the light passage opening; and an optical waveguide integrated in the printed circuit board.

In other words, an optoelectronic coupling unit with a circuit board is conceivable in which the guiding of light takes place in an optically conductive layer, which is provided in the board. In this case, the coupling-in of light can take place via openings which expose this optical material. In that case, these openings are no longer through openings as in the abovementioned example of a circuit board.

During the production of the module according to the first exemplary embodiment in accordance with the first aspect of the invention, after the application of the internal electrical connections and of the optoelectronic component and the contact-connection thereof, if appropriate with a bonding wire, the flexible electrical leads are applied and bent around the side areas of the substrate to the second main surface of the substrate, the second main surface being opposite to the first main surface, and are fixed there, whereon the external electrical connections are applied. Afterward, the module may also be surrounded by a suitable plastic injection-molding encapsulation.

By way of example, the optoelectronic component may be fixed directly on one of the internal electrical connections and project on one side, so that light radiation can pass through the transparent substrate from the optical fiber to the optoelectronic component, and vice versa. The interspace between the optoelectronic component and the substrate may be filled with a transparent potting compound.

In the second aspect of the present invention, the optoelectronic component is situated on the same side of the substrate on which the optical fiber is to be coupled, with the result that it is not necessary to use a transparent substrate. The optoelectronic component provided on a bottom area of a recessed section of the substrate may additionally be surrounded by a suitable transparent potting compound, into which a lens optical configuration can be integrated.

In accordance with the second aspect, too, the optoelectronic module can be combined to form an optoelectronic coupling unit by the external electrical connections being soldered onto electrical connections of a printed circuit board which has, between the connection contacts, a through opening on whose side remote from the module an optical fiber can be coupled. In this case, too, the circuit board need not necessarily have a through opening for coupling an optical fiber, but rather may equally have a light entry opening on one side to an optically conductive layer embedded in the board.

Other features which are considered as characteristic for the invention are set forth in the appended claims.

Although the invention is illustrated and described herein as embodied in an optoelectronic surface-mountable module and an optoelectronic coupling unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a diagrammatic sectional view of a second exemplary embodiment of an optoelectronic surface-mountable module in accordance with a first aspect of the invention;

FIG. 3 is a diagrammatic sectional view of a third exemplary embodiment of an optoelectronic surface-mountable module in accordance with a first aspect of the invention.

DESCRIPTION OF THE PREFERRED EMBODIMENTS

Referring now to the figures of the drawings in detail the optoelectronic module is in each case illustrated in a cross-sectional illustration along a plane running through the substrate, the leads, the external electrical connections and the printed circuit board.

Figure 1:
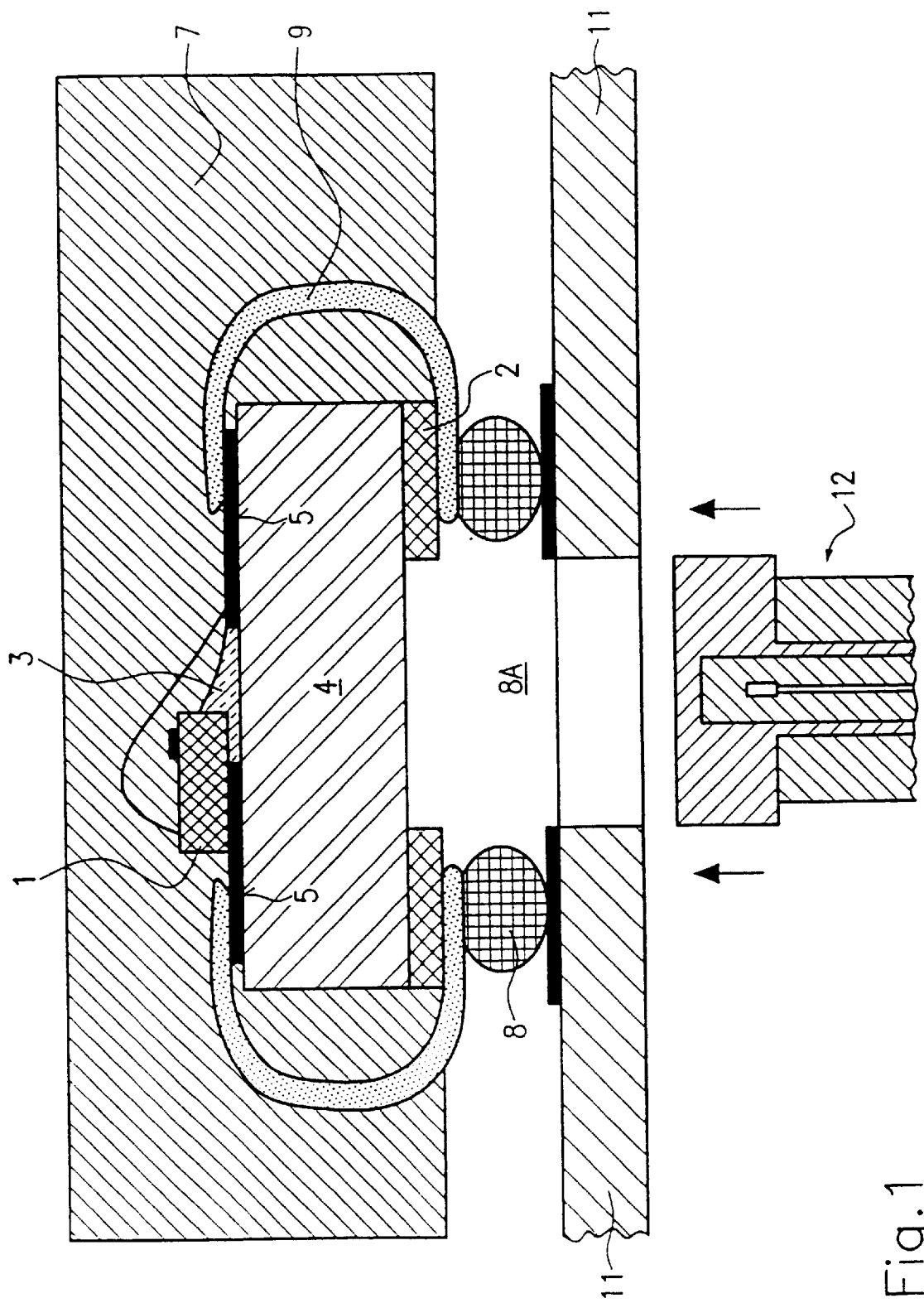
FIG. 1 is a diagrammatic sectional view of a first exemplary embodiment of an optoelectronic surface-mountable module in accordance with a first aspect of the invention.

The first exemplary embodiment—illustrated in FIG. 1—in accordance with the first aspect of the invention has a substrate 4, which is transparent to at least one of the wavelengths which can be utilized by the optoelectronic component. The wavelengths to be used are either emission wavelengths of an optoelectronic component 1, which is a transmitter such as a laser diode, or reception wavelengths for an optoelectronic component 1, such as a PIN photodiode, used as reception component. An individual component 1 or else a plurality of optoelectronic components can be mounted on the substrate in a manner described further below. In the exemplary embodiment shown, only an individual optoelectronic component 1 is illustrated, but the invention is not intended to be restricted to this case.

Firstly, internal electrical connections 5 are applied to the first main surface of the substrate 4, to which connections the optoelectronic component 1 is to be electrically connected. The optoelectronic component 1 is then mounted on one of these flat connections 5. The optoelectronic component 1 is applied to the connection 5 in such a way that received light radiation can pass through the transparent substrate 4 to the optoelectronic component 1 and, equally, light emitted by the optoelectronic component 1 can be coupled through the transparent substrate 4 into a coupled optical waveguide 12.

The space between the optoelectronic component 1 and the substrate 4 may, if appropriate, be filled with a transparent potting compound 3. Flexible leads 9 are applied to the internal electrical connections 5 and bent in a U-shaped manner around the side areas of the substrate 4 to the second main surface and are fixed there, if appropriate, using insulating spacers 2 on the substrate 4. By way of example, the spacers 2 may include a silicone polymer mixture. External electrical connections 8, preferably in the form of fusible bumps as ball grid array (BGA), are then applied to the underside of the electrical leads 9. A light entry opening or light exit opening 8A of the module is defined by the interspace between two or more external electrical connections 8.

In the exemplary embodiment described, the leads 9 are bent in a U-shaped manner around the side areas of the substrate 4 to the opposite main surface of the substrate. As an alternative to this, when a sufficiently electrically insulating substrate 4 is used, the electrical leads 9 can also be routed along through holes from one main surface to the opposite main surface.

The module can be soldered onto a printed circuit board 11 using SMT technology, the printed circuit board having electrical connections and electrical leads in printed-on form. The illustration only shows printed-on electrical connection areas of the circuit board 11 onto which the external electrical connections 8 of the module are placed and subsequently soldered for example through the use of the reflow method known in SMT technology. The circuit board 11 has a through opening through which light can be coupled into a connected optical waveguide 12 and light received from the optical waveguide 12 can be directed toward the module.

During the production of the module, after the bending-around of the electrical leads 9 and the application of the external connections 8, a shaped body 7 made of a suitable plastic may additionally be injection-molded on or integrally formed in order to protect the module against external adverse effects.

The same statements as those made for the first exemplary embodiment hold true for the elements of the exemplary embodiments illustrated in FIGS. 2 and 3, the elements being provided with the same reference symbols.

In the case of the second exemplary embodiment—illustrated in FIG. 2—in accordance with the first aspect of the invention, the external electrical connections are configured as the connection sections of a lead frame 10. The lead frame is fixed on the second main surface of the substrate 4 and a through opening 10A of the lead frame 10 forms the light entry opening or light exit opening of the module. In this case, the leads 9 are led merely from the internal electrical connections 5 on the first main surface of the substrate 4 to upper surfaces of lead frame connection sections. A lens 4A may be integrated into the second main surface of the substrate 4. With this lens, light can be coupled into a coupled optical fiber or light received from an optical fiber can be parallelized. The module in accordance with the second exemplary embodiment can also be connected to a circuit board in the manner described above.

In the case of the third exemplary embodiment—illustrated in FIG. 3—in accordance with the first aspect of the invention, the external electrical connections 21a are configured as parts of through contacts 21 through a plastic support 20 or are connected to through contacts 21 of this type. The plastic support 20 has a through opening 20A, which defines the light entry opening or light exit opening of the module. On their section 21b bearing on the upper surface of the plastic support 20, the through contacts 21 are connected to the internal electrical connections 5 via the leads 9. In addition, the module is surrounded by a transparent potting compound 30.

Figure 4:
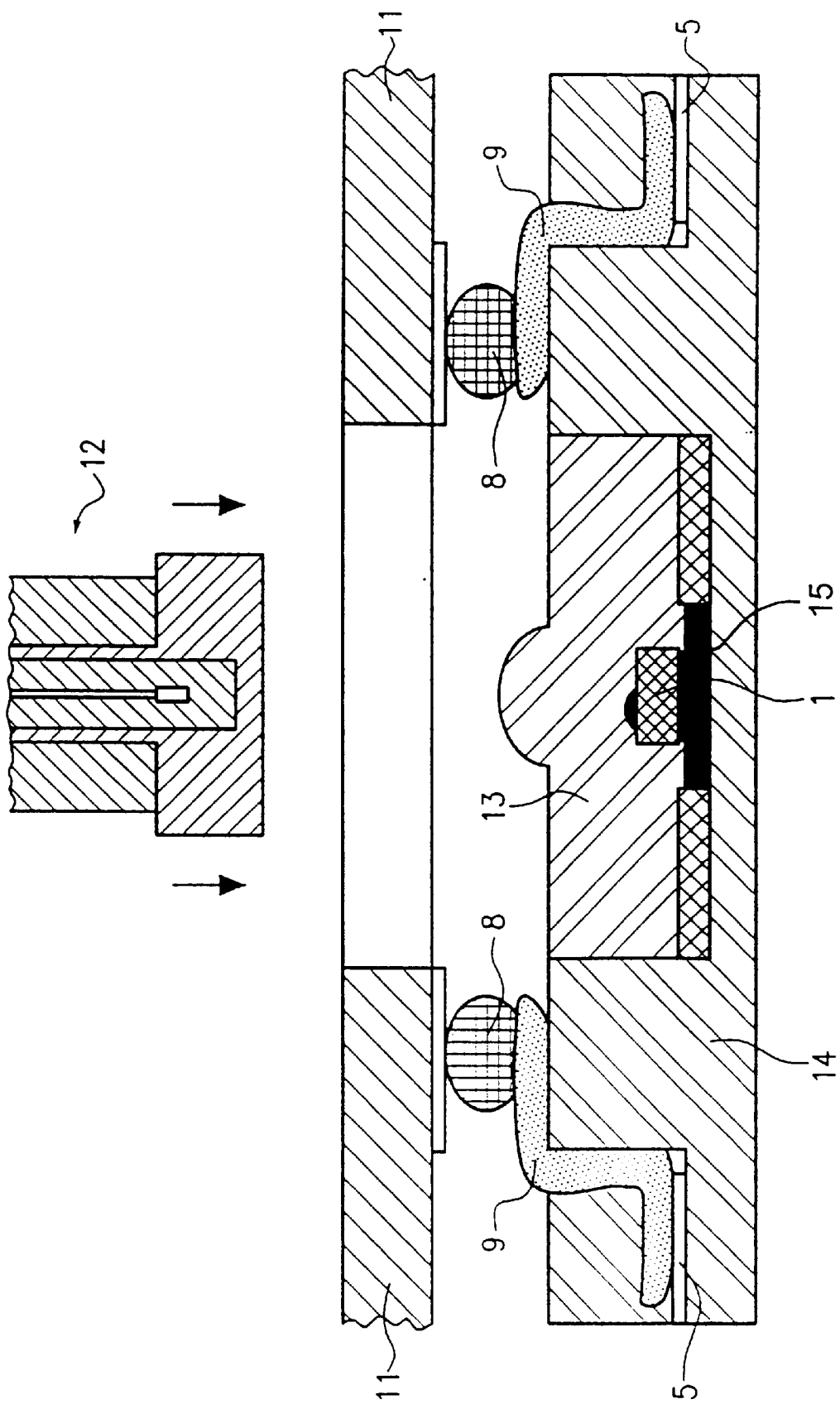
FIG. 4 is a diagrammatic sectional view of an exemplary embodiment of an optoelectronic surface-mountable module in accordance with a second aspect of the invention.

The exemplary embodiment—illustrated in FIG. 4—in accordance with the second aspect of the present invention has a substrate 14 with a relief structure of the main surface including recessed and elevated sections. In a recessed section, an optoelectronic component is mounted on a submount 15 connected to the substrate 14. The recessed section is filled with a transparent potting compound 13, into which a lens optical configuration can be integrated. Internal electrical connections 5, which are electrically connected to the optoelectronic component 1, are like-wise provided in recessed sections. External electrical connections 8, which are connected to the internal electrical connections 5 by electrical leads 9, are provided on elevated sections which bound the recessed section containing the optoelectronic component 1. Via these external contacts, which are represented as fusible bumps using BGA technology in this case, too, the module is connected to electrical connection areas of a printed circuit board 11. Between the external contacts 8, there is an opening in the printed circuit board 11, and an optical waveguide 12 can be coupled on the sides of the opening which are remote from the module.

Since, in the exemplary embodiment in accordance with the second aspect, the optoelectronic component 10 is provided on the same side of the substrate 4 on which the optical waveguide 12 is also coupled, the substrate 4 need not be configured as a transparent substrate.

We claim:

1. An optoelectronic surface-mountable module, comprising:
    a substrate having a first side with a first main surface and a second side with a second main surface opposite said first main surface;
    an optoelectronic component mounted on said first side of said substrate, said optoelectronic component utilizing a plurality of wavelengths;
    said substrate being transparent to at least one of the wavelengths utilized by said optoelectronic component;
    internal electrical connections provided on said first main surface and electrically connected to said optoelectronic component;
    external electrical connections connected to said second main surface of said substrate;
    electrical leads connecting said internal electrical connections to said external electrical connections; and
    said external electrical connections defining a light passage opening opposite said optoelectronic component, said external electrical connections being embodied as a lead frame having a through opening formed therein, said light passage opening being formed by said through opening in said lead frame.

2. The optoelectronic module according to claim 1, wherein said light passage opening is an opening selected from the group consisting of a light entry opening, a light exit opening, and a light entry and exit opening.

3. The optoelectronic module according to claim 1, wherein said external electrical connections are BGA connections.

4. The optoelectronic module according to claim 1, wherein:
    said external electrical connections are embodied as fusible bumps according to a BGA technology, said fusible bumps are connected to said electrical leads;
    two of said bumps are spaced from one another such that an interspace is formed between said two of said bumps; and
    said light passage opening is defined by said interspace between said two of said bumps.

5. The optoelectronic module according to claim 1, wherein:
    said substrate has side surfaces; and
    said electrical leads are U-shaped leads bent around said side surfaces and extending between said first main surface and said second main surface.

6. An optoelectronic surface-mountable module, comprising:
    a substrate having a first side with a first main surface and a second side with a second main surface opposite said first main surface;
    an optoelectronic component mounted on said first side of said, substrate, said optoelectronic component utilizing a plurality of wavelengths;
    said substrate being transparent to at least one of the wavelengths utilized by said optoelectronic component;
    internal electrical connections provided on said first main surface and electrically connected to said optoelectronic component;
    external electrical connections connected to said second main surface of said substrate, said external electrical connections defining a light passage opening opposite said optoelectronic component;
    electrical leads connecting said internal electrical connections to said external electrical connections;
    a plastic support having a through opening formed therein;
    said external electrical connections being embodied as through contacts extending through said plastic support; and said light passage opening being formed by said through opening of said plastic support.

7. The optoelectronic module according to claim 1, wherein said substrate is a silicon substrate.

8. The optoelectronic module according to claim 1, including a lens integrated into said second main surface of said substrate.

9. An optoelectronic surface-mountable module, comprising:

a substrate having a main surface;

said main surface having a relief structure with recessed sections and elevated sections, one of said recessed sections having a bottom area;

an optoelectronic component mounted in said bottom area of said one of said recessed sections, said optoelectronic component having connections;

internal electrical connections applied on given ones of said recessed sections and being electrically connected to said connections of said optoelectronic component;

external electrical connections applied on said elevated sections;

electrical leads connecting said internal electrical connections to said external electrical connections;

a transparent potting compound filling said one of said recessed sections containing said optoelectronic component; and a lens integrated in said transparent potting compound.

10. An optoelectronic coupling unit, comprising:

a substrate having a first side with a first main surface and a second side with a second main surface opposite said first main surface;

an optoelectronic component mounted on said first side of said substrate, said optoelectronic component utilizing a plurality of wavelengths;

said substrate being transparent to at least one of the wavelengths utilized by said optoelectronic component;

internal electrical connections provided on said first main surface and electrically connected to said optoelectronic component;

external electrical connections connected to said second main surface of said substrate;

electrical leads connecting said internal electrical connections to said external electrical connections;

said external electrical connections defining a light passage opening opposite said optoelectronic component;

a printed circuit board electrically connected to said optoelectronic component;

said printed circuit board having a through opening formed therein, said through opening being aligned with said light passage opening; and said printed circuit board having a side remote from said optoelectronic component and being configured to be coupled to an optical waveguide at said side remote from said optoelectronic component.

11. An optoelectronic coupling unit, comprising:

a substrate having a first side with a first main surface and a second side with a second main surface opposite said first main surface;

an optoelectronic component mounted on said first side of said substrate, said optoelectronic component utilizing a plurality of wavelengths;

said substrate being transparent to at least one of the wavelengths utilized by said optoelectronic component;

internal electrical connections provided on said first main surface and electrically connected to said optoelectronic component;

external electrical connections connected to said second main surface of said substrate;

electrical leads connecting said internal electrical connections to said external electrical connections;

said external electrical connections defining a light passage opening opposite said optoelectronic component; and a printed circuit board electrically connected to said optoelectronic component;

said printed circuit board having a lateral entry opening formed therein, said lateral entry opening being aligned with said light passage opening; and an optical waveguide integrated in said printed circuit board.

* * * * *